(12) United States Patent
Pfaendtner et al.

(10) Patent No.: US 6,884,476 B2
(45) Date of Patent: Apr. 26, 2005

(54) CERAMIC MASKING MATERIAL AND APPLICATION METHOD FOR PROTECTING TURBINE AIRFOIL COMPONENT SURFACES DURING VAPOR PHASE ALUMINIDING

(75) Inventors: Jeff Pfaendtner, Blue Ash, OH (US); James Ruud, Delmar, NY (US); Ted Grossman, Hamilton, OH (US); Peter Meschter, Niskayuma, NY (US); Joseph Rigney, Milford, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/281,544

(22) Filed: Oct. 28, 2002

(65) Prior Publication Data

US 2004/0081767 A1 Apr. 29, 2004

(51) Int. Cl.[7] .............................. C23C 14/30
(52) U.S. Cl. .................. 427/596; 427/250; 427/252; 427/255.18; 427/255.12; 427/255.31; 427/255.32; 427/282; 204/192.16
(58) Field of Search ............... 427/596, 250, 427/252, 255.18, 255.12, 255.31, 255.32, 282, 421; 204/192.16

(56) References Cited

U.S. PATENT DOCUMENTS

| | | |
|---|---|---|
| 3,647,497 A | 3/1972 | Levine et al. |
| 3,785,854 A | 1/1974 | Baldi |
| 3,801,357 A | 4/1974 | Speirs et al. |
| 3,904,789 A | 9/1975 | Speirs et al. |
| 4,128,522 A | 12/1978 | Elam |
| 4,132,816 A | 1/1979 | Benden et al. |
| 4,148,275 A | 4/1979 | Benden et al. |
| 4,181,758 A | 1/1980 | Elam |
| 4,332,843 A | 6/1982 | Ahuja |
| 4,347,267 A | 8/1982 | Baldi |
| 4,464,430 A | 8/1984 | Baldi |
| 4,617,202 A | 10/1986 | Baldi |
| 4,845,139 A | 7/1989 | Baldi |
| 4,978,558 A | 12/1990 | Lamm |
| 5,068,127 A | 11/1991 | Fournes et al. |
| 5,264,245 A | 11/1993 | Punola et al. |
| 5,368,888 A | 11/1994 | Rigney |

(Continued)

Primary Examiner—Timothy Meeks
(74) Attorney, Agent, or Firm—McNees Wallace & Nurick LLC

(57) ABSTRACT

A masking material and a method for applying the masking material to preselected surfaces of a component to protect the surfaces to which the masking material is applied from exposure to a vapor phase of aluminum gas while a protective environmental coating is applied to other surfaces of the component. The component, such as found in the hot section of a gas turbine engine, typically has intricate internal passageways. A ceramic material is applied as a mask over preselected surfaces while leaving remaining surfaces of a component exposed. The component typically is a superalloy component, and the exposed surfaces are to be coated with an environmental protective coating. The surfaces are preselected on the basis of whether coating is desired on the surface. The ceramic material forms a continuous, crack-free mask on these preselected surfaces without obstructing the internal passageways. The ceramic material which forms a mask is stable at the elevated temperatures of environmental coating application. The ceramic mask material must be continuous and substantially crack-free to prevent the penetration of the aggressive gas phase of the environmental coating material onto the surface of the component where it would otherwise undesirably be deposited. The ceramic material does not react with either the surface of the superalloy component or the gaseous vapors of the coating composition. At the conclusion of the coating operation, the ceramic coating applied as a mask can be easily and completely removed from the surface of the substrate by simple mechanical means, which surface is free of any coating from the coating operation.

27 Claims, 1 Drawing Sheet

U.S. PATENT DOCUMENTS

| | | |
|---|---|---|
| 5,523,165 A | 6/1996 | Walter et al. |
| 5,725,905 A | 3/1998 | Walter et al. |
| 5,800,695 A | 9/1998 | Kang et al. |
| 5,989,733 A * | 11/1999 | Warnes et al. ............... 428/652 |
| 6,183,811 B1 | 2/2001 | Conner |
| 6,194,026 B1 * | 2/2001 | Warnes et al. ............... 427/180 |
| 6,207,233 B1 | 3/2001 | Perry et al. |
| 6,265,022 B1 * | 7/2001 | Fernihough et al. ........ 427/142 |
| 6,273,678 B1 | 8/2001 | Darolia |
| 6,332,926 B1 * | 12/2001 | Pfaendtner et al. ......... 118/721 |
| 6,616,969 B1 * | 9/2003 | Pfaendtner et al. ......... 427/237 |
| 2003/0041923 A1 * | 3/2003 | Kircher ..................... 148/240 |

* cited by examiner

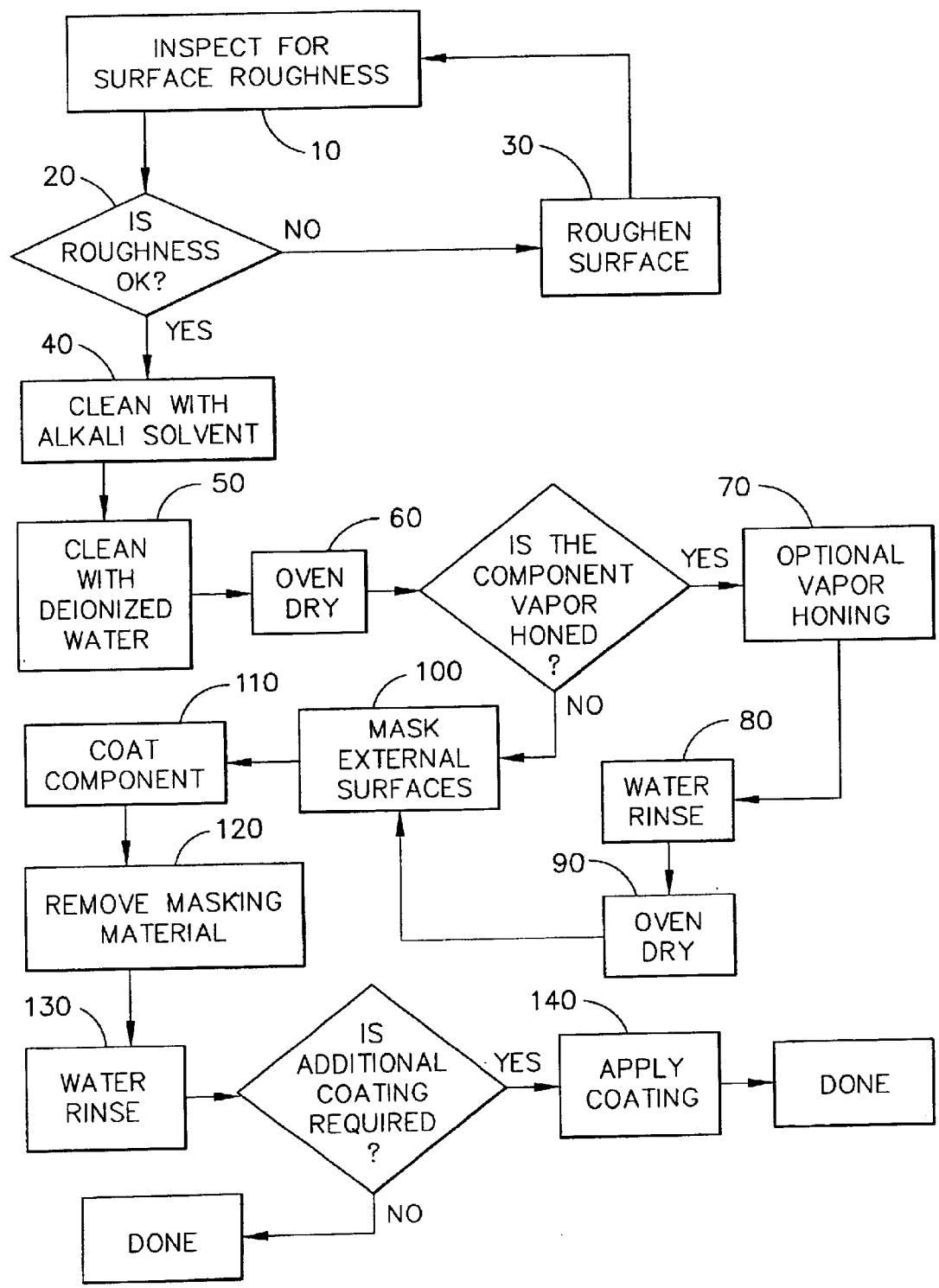

CERAMIC MASKING MATERIAL AND APPLICATION METHOD FOR PROTECTING TURBINE AIRFOIL COMPONENT SURFACES DURING VAPOR PHASE ALUMINIDING

FIELD OF THE INVENTION

The present invention generally is directed to protecting selected component surfaces from coating during high temperature coating operations of a component, and specifically is directed to protecting selected component surfaces of gas turbine superalloy components having internal passageways during high temperature coating operations using aggressive deposition gases.

BACKGROUND OF THE INVENTION

Hot section components commonly found in the combustor and turbine section of modern gas turbine engines are made of high temperature alloys selected from the group consisting of nickel-based superalloys, iron based superalloys, cobalt-based superalloys and combinations thereof. These superalloys have been developed to meet the demands of higher operating temperature while being able to survive the severe environment of the hot section of the gas turbine. In order to improve the survivability of the component at high temperatures under corrosive and oxidative conditions, protective coating systems typically are applied to the components. These coating systems typically include an environmental coating, which also serves as a bond coat, and usually a thermal barrier coating overlying the environmental or bond coat.

The environmental coatings, which may be used without thermal barrier coating, or bond coatings, are typically metallic overlay coatings of MCrAl(X) where M is an element selected from the group consisting of Co and Ni and combinations thereof and (X) is an element selected from the group of rare earth elements and Y, Hf, W, Zr, La and combinations thereof, or diffusion aluminide coatings such as NiAl or modified NiAl that includes an element such as Pt, Rh or Pd. The optional thermal barrier coatings are ceramic materials, usually a yttria-modified zirconia. The thermal barrier coatings are applied over environmental coating or bond coatings, as the adhesion of the thermal barrier coatings to these coatings is far superior to the long-term adhesion of these coatings to the base metal superalloys.

Various well-known methods are used to apply both the environmental coatings and the ceramic thermal barrier coatings to the hot section components. As the operating temperatures have become higher and the environmental conditions have become harsher, additional cooling in the form of serpentine internal cooling passageways has been added, where practical, to these hot section components. Of course, because the surfaces of these passageways are also subject to environmental attack, it has been necessary to apply coatings to provide environmental protection to these surfaces. While a wide variety of methods are available to apply environmental coatings to the external surfaces of the hot section components, not all of these methods can be used successfully for coating of the serpentine internal passageways. For example, line-of-sight methods such as for example, EB-PVD, sputtering, directed vapor deposition (DVD), cathodic arc and thermal spray, are ineffective, and plating methods are not easily employed.

In order to successfully provide an environmental protective coating to the serpentine internal cooling passages of a hot section component such as a turbine airfoil, the current state of the art utilizes a gas phase of the coating species, aluminum or chromium and other reactive elements (Hf, Y, Zr etc.) and combinations thereof, which is passed through the serpentine passages and deposited on the internal surfaces. These gas phases are generated at high temperatures by well-known processes such as chemical vapor deposition (CVD), vapor phase aluminiding (VPA) and above-the-pack deposition. Current commercial CVD and VPA techniques, in efforts to be cost effective, are usually used to simultaneously coat both the surfaces of the internal passageways and the external surfaces of the component. The rate of coating deposition on the external surfaces can be greater than the deposition rate on the internal surfaces. However, the thin airfoil walls are an important consideration, as the metallic vapor combines with the substrate surface material to form the coating. This decreases the effective substrate wall thickness as substrate elements combine with the metallic vapor to form a coating and undesirably leads to wall consumption over time. Dimensional accuracy of the component is also important, since the component must fit up with mating surfaces, for example, platform edges of a turbine blade, so that even if a coating is permitted, its thickness must be carefully controlled. In some circumstances, excessive coating can adversely affect the base metal composition by altering the composition and perhaps generating undesirable phases. The alteration of the base material can cause a decrease in the load-bearing capability of the base material. This can result in a shortened life of the component, and can adversely affect the ability to repair and reuse the component. And certainly, if the coating is built up to an excessive thickness, it no longer performs as a coating, but rather behaves as bulk material, which also is undesirable, as these bulk materials generally lack the required mechanical properties.

In order to protect these surfaces from any coating, or from a coating build up that is excessive, it is necessary to mask these surfaces while the internal serpentine passageways are being coated. These masking methods are well known and described in, for example, U.S. Pat. Nos. 4,464, 430, 3,801,357 to Baldi, U.S. Pat. No. 4,128,522 to Elam. U.S. Pat. No. 3,647,497 to Levine et al., and U.S. Pat. No. 4,978,558 to Lamm et al. Each of these can be effective, but typically require application of a plurality of masking layers with intermediate operations. This is both time-consuming and expensive. These masking materials often make use of sacrificial layers of metal such as Ni and Cr and combinations thereof. These typically are applied as tapes, slurries and putties that perform as "getters" of the aluminiding gases, whose purpose is to cause a reaction with the sacrificial layer before the gases can reach the surface of the component intended to be protected. In addition, certain masking methods utilize materials that either burn off leaving small portions of the substrate exposed or form cracks that permit migration and deposition of the gaseous phase onto the substrate. Additionally, the masking layers can be tightly adherent and difficult to remove.

What is needed is a masking material that can be readily applied over surfaces that desirably are not to be exposed, but which otherwise would be exposed to the aluminum-bearing gaseous phase during coating operations at high temperatures. The masking material must be easy to apply, capable of surviving high temperatures and must form a continuous, crack-free protective layer over the surfaces that are not being coated. The masking material must not react with the substrate material. Furthermore, while the masking material must bond to the surface, it must be readily and completely removable from the surface without the need to heavily work the surface mechanically or subject the surface to harsh chemicals.

SUMMARY OF THE INVENTION

The present invention provides a masking material and a method for applying the masking material to preselected surfaces of a component that protects the surfaces to which it is applied from exposure to a metallic vapor phase of at least one element selected from the group consisting of Al, Cr, Hf, Zr, Si and the like while a protective environmental coating is applied to other surfaces of the component. The component, such as found in the hot section of a gas turbine engine, typically has intricate internal passageways.

The present invention utilizes a ceramic material applied over preselected surfaces while leaving remaining surfaces of a component exposed. The component typically is a superalloy component, and the exposed surfaces are to be coated with an environmental protective coating. The surfaces are preselected on the basis of whether coating is desired on the surface. The ceramic material forms a continuous, crack-free mask on these preselected surfaces without obstructing the internal passageways. The passageways and cooling holes are maintained free of the ceramic material during application by maintaining a positive flow of gas through the passageways during application of the ceramic material. The ceramic material, which forms a mask, is stable at the elevated temperatures of coating application. Coating material is deposited by exposing the substrate to gaseous vapors of the coating, typically 1400° F. and above for a period of time sufficient to achieve a predetermined coating thickness on exposed surfaces of the component. The ceramic material must be continuous and crack-free to prevent the penetration of the aggressive gas phase of the coating material or reactive by-products onto the surface of the component where it will undesirably be deposited. The ceramic material does not react with the surface of the superalloy component, which is to say, there is no diffusion of elements from the ceramic material into the superalloy substrate and no diffusion of elements from the superalloy substrate into the ceramic material at the elevated temperatures of coating or during application of the ceramic material as a mask. The ceramic material also does not react adversely with the gaseous vapors of the coating composition so that coating of the desired surfaces can be accomplished more quickly. In addition, at the conclusion of the coating operation, the ceramic coating applied as a mask can be easily and completely removed from the surface of the substrate by simple mechanical means, which surface is free of any coating from the coating operation. A brittle material is more readily removable than a ductile material.

The ability to provide a continuous crack-free ceramic coating is affected by the method of application of the coating. The present invention envisions application of a ceramic coating composition preferably by the sol gel process. Sol-gel processing is a chemical solution method to produce a ceramic oxide. The chemical solution, an alkoxide precursor or a metal salt, is combined with ceramic precursor materials. A gel is formed as the solution is heated to slightly dry it at a first preselected temperature for a first preselected time. The gel is applied over the surface or surfaces to be masked. Proper application of the ceramic precursor materials and an inert filler and proper drying produce a continuous film over the masked area. The gel is then fired at a second elevated preselected temperature above the first elevated temperature for a second preselected time to produce a dense, thick matrix free of shrinking and cracks. The matrix is sufficiently thick and dense to prevent gas phase from diffusing through it to affect the underlying substrate. The matrix has no maximum thickness, but practically, should be kept sufficiently thin to minimize costs and processing times which will increase with increasing thickness. The matrix has a thickness of between about 0.5–300 microns thick.

An advantage of the present invention is that it provides a continuous, crack-free, masking material that can survive at temperatures above 1400° F. while protecting the underlying substrate from exposure to metallic gas phases such as the gas phases of the aluminiding process.

Another advantage of the present invention is that at the high coating temperatures experienced in VPA or CVD coating processes, the present invention substantially does not react with either the gaseous metallic coating material such as the aluminide coating material or the underlying superalloy substrate.

Another advantage of the present invention is that it can inexpensively and easily be applied using the sol gel process. Furthermore, while the material forms an acceptable bond with the substrate for the purposes of masking, the bond is not so strong as to make removal from the substrate difficult at the conclusion of the coating process. In addition, because the coating is brittle, the complete removal from the substrate is facilitated by simple mechanical cleaning methods.

Another advantage of the present invention is that it permits the use of the VPA coating process to coat the internal surfaces of new articles without forming an excessively thick coating on the external surfaces, and it permits the coating of the internal coating of articles that are already coated with an environmental coating, such as turbine blades that are to be refurbished, without the need to strip existing environmental coatings from the exterior surfaces of such articles, as is currently the practice.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

FIG. 1 is a flow chart of the process of the present invention.

DETAILED DESCRIPTION OF THE INVENTION

The present invention provides a ceramic masking material for use during high temperature coating operations in which a coating is accomplished by exposing the component to at least one gas phase selected from the group consisting of a metallic-bearing gas phase at high temperatures, where the metal includes at least one metallic element selected from the group consisting of Al, Cr, Hf, Zr, Y and reactive elements from Group IIIA, Group IIIB, Group IVA and Group IVB. The coating is deposited on the area of the component as it contacts the exposed surface of the component. The present invention shields surfaces of the component from the coating by preventing the coating gas from contacting the component.

The gas-phase coating operations are typically diffusion processes and are not line-of-sight coating operations, which means that an unobscured path between the coating source and the surface to be coated is not necessary to coat the substrate surface. The gas phase coating operations are particularly effective for use in coating hot section components of a gas turbine engine such as turbine section components or combustor section components. In advanced gas turbine engines, these components, which include but are not limited to, rotating blades, fixed vanes and combustor liners, may have cooling holes to provide active cooling during operation. These cooling holes require coating for component durability, but cannot be coated using line-of sight methods. The gas phase coating operations can effectively be used to coat the surfaces of these cooling holes which may include complex configurations such as serpentine passages manufactured into the structure in the as-cast configuration. The gas phase coating operations typically include CVD processes and VPA processes. These processes are used to deposit an environmental coating, typically an aluminide coating, on these internal passageways. The present invention is used to prevent deposition on surfaces which are not to be coated, or on which coating thickness must be limited. And while the present invention is very useful when used in conjunction with these gas phase processes, it is not so limited. It can also successfully be used in other coating operations, such as line-of-sight coating operations to protect surfaces immediately adjacent to the region to be coated, and electrodeposition plating methods. It can also be used in stripping operations where stripping involves exposure of surfaces to a reactant which is harmful to the substrate material.

In other situations, an environmental coating may already have been deposited or formed on the surface of an article. For example, blades that are removed from service typically have an environmental coating, such as an aluminide coating. In certain cases, the environmental coating may have been applied to new blades. However, attempting to apply an additional overlay coating on an existing coating, such as a vapor phase aluminide (VPA) coating is undesirable, as it has been demonstrated that such additional coatings adversely affect the furnace cycle test (FCT) performance and the oxidation performance of such coatings, thereby affecting blade life. The present invention can be used to VPA coat preselected surfaces of these articles, such as internal passageways, without the need to strip the existing environmental coatings, such as aluminides, from the article. By utilizing the processes of the present invention, a masking can be applied to any acceptable prior coating, which will protect the coating from being adversely affected as the new VPA coating is applied to the substrate. After completion of the VPA coating, the masking material can be removed.

Even though these processes can be used in certain circumstances to simultaneously coat both the internal and external surfaces of a component having cooling holes leading to serpentine cooling passageways within the component, the size of the cooling holes entering the passageways, frequently only 0.005–0.050" in diameter, limits the flow rate of the gas that can enter. As a result, external surfaces which are larger and over which larger volumes of gas will flow, will receive a thicker coating per unit time than will the restricted serpentine passageways. There are multiple methods for accomplishing coating of such restricted passageways without excessive coating build-up on external surfaces, two of which include (1) mechanically channeling the flow of coating gases into the passageways while inhibiting gas flow over external surfaces, or, (2) masking of external surfaces from contact with the coating gas while exposing the entire component to the coating gas. The channeling techniques entail the use of costly specialized equipment and time-consuming assembly operations. The number of pieces that can be processed is also severely limited by the size of the specialized equipment. This invention employs masking techniques.

The masking material of the present invention utilizes ceramic materials that are chemically stable in the gas phase atmospheres developed in CVD and VPA processes. The masking materials must be capable of withstanding the high coating temperatures, above 1400° F., and typically in the range of 1900°–2000° F. The ceramic masking materials also must not react or be deteriorated significantly by contact with activators used in these coating processes that generate metallic-halide vapors from the elemental form of the coating material, nor other gaseous by-products. These ceramic materials also are inert with respect to the superalloy substrate, which typically is comprised of nickel-based superalloy materials, cobalt-based superalloy materials, iron-based superalloy materials and superalloy materials that are based on combinations of nickel, cobalt and iron. Furthermore, the ceramic materials must be stable at the high temperatures of the coating operation. However, not all ceramic materials provide acceptable results as a masking material. Ceramic materials frequently are brittle and develop cracks which unacceptably expose the substrate base material. As the prior art also teaches, some materials that are used for masking act as a getter for the coating gas. Thus, pure $Y_2O_3$, $Ce_2O_3$, $TiO_2$, and $SiO_2$ are not acceptable materials for use as a mask. These materials can undergo significant exchange reactions with the vapor phase or may even decompose in the presence of the gaseous or vapor phase.

An important factor in the present invention is the ability of the masking material to be applied as a continuous, crack-free layer over the surface or area that is to be masked. The masking material must adhere sufficiently to the surface or area to which it is applied to allow routine handling of the component without damaging the masking material, yet it must not bond tenaciously to the surface or area to which it is applied. Bonding can be of a mechanical nature and can be accomplished by ascertaining that the surface finish of the substrate is sufficiently rough to allow the masking material to form primarily a mechanical bond between the masking material and the substrate, although some slight chemical bonding may also occur. A surface roughness of 32 microinches or rougher is required, although a surface finish of 50 microinches or rougher is preferred. If the surface finish is too smooth, the surface can be roughened as needed, such as by an optional grit blasting procedure. Once applied, the layer should be capable of being removed with little difficulty using conventional techniques including but not limited to grit blasting or autoclave removal in a caustic solution of KOH or NaOH. Not all methods for applying ceramic materials provide an acceptable crack-free layer. Some methods of applying ceramic materials to surfaces inherently introduce cracks into the ceramic. Other methods such as sputtering can be used to apply the crack-free ceramic, but currently are slow and more costly than the preferred method of the present invention. For many applications, the presence of cracks in the ceramic is irrelevant, or may even be a desired result. However, these cracks are unacceptable in masking materials such as set forth in the present invention. The sol-gel process is one preferred method that has been found to be effective in applying a crack-free layer of ceramic material over a surface to be masked, although air plasma spraying, EB-PVD and other PVD processes may also be effective.

The sol-gel process involves forming a solution that includes the desired species of ceramic material. The solution is a precursor that is gelled to a preselected viscosity by heating the solution at a first preselected temperature for a first preselected time. An inert filler may be added to the precursor. The sol-gel material may be applied to the material by any convenient technique. It can be applied by spraying a plurality of thin layers to build up to the desired thickness. The viscosity is determined by the working characteristics desired, but typically can be formed and applied to a preselected thickness, yet is sufficiently rigid that it will not flow as a result of gravitational effects during normal processing time. The gel is applied over the surface or surfaces to be masked and dried by firing at first preselected temperature to drive off the volatile component of the precursor material. Drying produces a continuous film over the masked area. If drying does not produce a continuous film, then the solution was too rich in the volatile component, the ratio of ceramic material+inert filler to precursor being incorrect, and the masking material should be removed as the masking material will likely crack during further processing. However, once a continuous film is achieved after the drying step, the film is then fired at a second elevated preselected temperature above the first elevated temperature for a second preselected time to produce a dense, thick matrix free of shrinking and cracks. The dense matrix has a thickness preferably of about 0.5–125 microns and most preferably of about 0.5–20 microns.

Other acceptable methods for applying a crack-free ceramic material as a masking layer over a surface include thermal spray, aerosol spray, or chemical and vapor deposition. The crack-free layer may be achieved by the appropriate combination of ceramic material and inert filler by these processes using techniques well known to those skilled in each of the respective arts.

Acceptable ceramic materials for use as a masking material include TiN, ZrN and HfN and combinations thereof. Preferred ceramic materials for use as a masking material include $Al_2O_3$, $CaF_2$, $SrF_2$, $BaF_2$, and AlN. $Sc_2O_3$, $ZrO_2$ and $HfO_2$ are ceramic materials that may be acceptable as masking materials, depending upon the kinetics of reactions that can occur with the gaseous phase. Their use could depend upon the temperature of the gaseous phase, the mechanism of their reaction with the gaseous phase and the rate of any interaction.

EXAMPLE

A high-pressure turbine blade from an aircraft engine designated as a CFM56 engine was coated using the present invention. After inspecting the blade to assure that the surface finish was sufficiently rough to permit adhesion of a masking layer, the turbine blade was cleaned with a solvent and then rinsed with deionized water. A masking material of 7-YSZ (yttria-stabilized zirconia having 7% yttria)+zirconia ($ZrO_2$) was applied over 75% of the external surface of the blade, leaving exposed those external portions of the blade on which an environmental coating was desired. The masking material was applied using a line-of-sight EB-PVD technique. Masking material was applied over bare substrate material. The airfoil was then exposed to an aluminizing treatment using a commercial low-activity VPA process that entailed loading about 200 lb. of CrAl pellets (33 wt. % Al) into a furnace along with about 300 grams of $AlF_3$. The $AlF_3$ serves as an activator. The furnace was brought to a coating temperature of about 1975° F. over a period of about three and a half hours at which time argon was passed through the mixture at a flow rate of about 150 scfh to transport the Al—F vapors to the blade. This aluminiding treatment continued for about 5–6 hours at a temperature of about 1975° F. The coating operation was terminated and the furnace was cooled. The masking layer was removed from the surfaces of the blade by grit blasting and the blade was sectioned. No aluminide coating was observed in the area of the blade which was masked by the coating of the present invention. However, the 25% of the blade that was not masked had a coating applied to a thickness of 0.001" (1 mil).

To confirm the effectiveness of the ceramic masking material, monolithic pieces of $Al_2O_3$ and $ZrO_2$ were exposed to an aluminum coating gas using essentially the same coating parameters as set forth in the above example. At the conclusion of the 5–6 hour coating process, the pieces were removed from the furnace and inspected visually, dimensionally and by weighing. There were no dimensional changes, and no weight changes to the pieces. The visual inspection disclosed that no coating material adhered to the pieces. This confirms that these materials are stable in the VPA environment and suitable as a masking material, neither deteriorating in the environment nor picking up coating as an adherent or getter.

The process for coating a turbine engine component in accordance with the present invention is set forth in the flow chart depicted in FIG. 1. A turbine engine component is inspected for surface roughness 10. If the component is determined not to be sufficiently rough 20, then it is roughened 30 and then cleaned using an alkali solvent 40. The roughening 30 is accomplished using grit blasting or vapor honing. When the components containing internal passageways are grit blasted or vapor honed, air or water is directed through the internal passageways to prevent the passageways from being obstructed by the media used in these operations. Once the component is determined to be sufficiently rough 20, that is having a surface finish preferably of 50 microinches or rougher, it is passed on to be cleaned using an alkali solvent 40. Preferably, cleaning with the alkali solvent is accomplished by immersion in an ultrasonic tank. The component is then cleaned with deionized water 50, also preferably by immersion in an ultrasonic tank. The component is oven dried 60 at a temperature sufficient to remove the water, typically above about 150° F. The component may undergo an optional vapor honing operation 70, followed by a water rinsing 80 and oven drying 90, again at a temperature sufficient to remove water. The external surfaces of the component which are not to be coated are masked 100 with the ceramic material of the present invention using any acceptable technique that provides a continuous, crack-free ceramic layer over these surfaces. Special care is taken during application of the ceramic masking material that no internal passageways are blocked. The internal passageways are then coated 110 using well-known conventional CVD or VPA techniques. Any exposed, unmasked external surfaces are also coated. After coating, the masking material is completely removed from the external surfaces of the component 120, typically by grit blasting, although any other mechanical technique such as tumbling or mechanical working, chemical process such by autoclaving the component in a solution including NaOH or KOH may be utilized. If necessary, the surface finish of the component is restored by a suitable procedure such as continued grit blasting, vapor honing, hand finishing or tumbling. The article is water rinsed 130. If the external surface requires application of a bond coat or environmental coat and optional thermal barrier coating 140, the blade is processed in the usual manner.

As noted, various methods may be used to apply the masking to the component, but sol gel is the preferred process. A preferred ceramic masking material is zirconia stabilized with 7% yttria (7YSZ). An inert filler may be used with the ceramic masking material. The process has been demonstrated with optional YSZ, although alumina and other inert fillers may also be used. These materials should be inert with respect to the substrate material and to the vapors generated in a gas-phase process such as will occur in an aluminiding atmosphere that includes halides of aluminum, activator, hydrogen compounds, halides and other by-products. The chemical solution of the 7-YSZ+ zirconia particles, 3 mol %, combined with zirconium n-propoxide (70% by weight) diluted in 2-propanol with propanol and nitric acid is formed by mixing and stirring. A second solution of yttrium acetate dissolved in propanol and nitric acid is added and stirred. After about one hour, distilled water is added by stirring, and the solution is allowed to stand for about 10 hours. The final solution will have molar ratios of zirconium n-propoxide:propanol:water:nitric acid or 1:15:5:1. The solution can be applied to the surface and dried to form a gel or a gel can be formed by drying for a sufficient time, typically about 10–60 minutes although longer times are required for thicker layers of gel, at a temperature in the range of 175° F.–300° F. and then applied to the surface of the article. The gel produces a continuous film over the masked area. The component can then be heated to a temperature in the range of about 750° F. to about 1600° F. for a time sufficient to produce a dense, thick matrix free of shrinking and cracks, typically about 10–20 minutes. While the coating can adhere well to the substrate, it can be readily removed from the substrate surface by mild mechanical working, without damaging the substrate.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for applying an environmental coating to predetermined areas of a superalloy component having internal passageways, comprising the steps of:

preselecting first surfaces of the superalloy component;

applying a ceramic material to form a ceramic layer over the preselected first surfaces of the superalloy component while leaving remaining surfaces of the superalloy component exposed and without obstructing the internal passageways, the ceramic material forming a substantially crack-free, continuous layer bonded to the preselected first surfaces, the layer being stable at temperatures above about 1400° F. without substantially reacting with the first surfaces of the superalloy component, the component having exposed predetermined surfaces and protected preselected first surfaces layered with ceramic material;

applying an environmental coating to the exposed predetermined surfaces of the superalloy component by flowing gaseous vapors of an environmental coating composition over the surfaces of the component at temperatures above about 1400° F. for a time sufficient to achieve a predetermined coating thickness on the exposed predetermined surfaces, the ceramic layer applied over the preselected first surfaces of the component preventing a reaction between the gaseous vapors and the preselected first surfaces; then completely removing the ceramic layer from the preselected first surfaces of the superalloy component, thereby exposing the protected preselected first surfaces of the component underlying the ceramic layer, the protected preselected first surfaces being substantially free from the environmental coating composition while the predetermined surfaces include an environmental coating of predetermined thickness formed by reaction of the gaseous vapors and the exposed predetermined surfaces.

2. The method of claim 1 wherein at least a portion of the preselected first surfaces of the superalloy component further include an environmental coating.

3. The method of claim 2 wherein the environmental coating is an aluminide.

4. The method of claim 1 wherein the step of applying a ceramic material to form a ceramic layer includes the additional steps of:

forming a gel over the preselected first surfaces by application of a chemical solution comprising a ceramic precursor, an inert filler and a precursor selected from the group consisting of a metal salt and an alkoxide and heating to a first preselected temperature for a first preselected time; then firing the gel at a second preselected temperature above the first preselected temperature for a second preselected time to produce a thick, dense matrix substantially free of shrinkage and cracks over the preselected first surfaces.

5. The method of claim 4 wherein the step of forming the gel over the preselected first surfaces includes applying a sufficient quantity of the chemical solution to form a dense matrix having a thickness of about 0.5–300 microns after firing.

6. The method of claim 5 wherein the thickness of the dense matrix is about 0.5–125 microns.

7. The method of claim 6 wherein the thickness of the dense matrix is about 0.5–20 microns.

8. The method of claim 1 wherein the step of applying a ceramic material to form a ceramic layer includes the step of applying the ceramic material by a physical vapor deposition process.

9. The method of claim 1 wherein the step of applying a ceramic material to form a ceramic layer includes the step of applying the ceramic material by EB-PVD.

10. The method of claim 1 wherein the step of applying a ceramic material to form a ceramic layer includes the step of applying the ceramic material by sputtering.

11. The method of claim 1 wherein the step of applying a ceramic material to form a ceramic layer includes the step of applying the ceramic material by aerosol spray.

12. The method of claim 1 wherein the atop of applying an environmental coating by flowing gaseous vapors includes a diffusion gas phase coating process selected from the group consisting of vapor phase deposition (VPA) and chemical vapor deposition (CVD).

13. The method or claim 1 wherein the step of applying an environmental coating includes flowing gaseous vapors of at least one gas phase selected from the group consisting of a reactive element bearing gas phase, an aluminum bearing gas phase and a chromium bearing gas phase.

14. The method of claim 13 wherein the reactive element bearing gas phase is selected from the group consisting of Hf, Zr, Y and combinations thereof.

15. The method of claim 1 wherein the step of applying a ceramic layer includes applying a ceramic material selected from the group consisting of ZrN, TiN, HfN, $Al_2O_3$, $CaF_2$, $SrF_2$, $BaF_2$, AlN, $Sc_2O_3$, $ZrO_2$ and $HfO_2$.

16. The method of claim 1 wherein the step of applying a ceramic layer includes applying yttria-stabilized zirconia.

17. The method of claim 16 wherein the yttria-stabilized zirconia includes, by weight, about 7% yttria.

18. The method of claim 17 wherein the step of applying a ceramic layer includes applying yttria-stabilized zirconia plus an inert filler.

19. The method of claim 18 wherein the inert filler is alumina.

20. The method of claim 18 wherein the inert filler is zirconia.

21. The method of claim 20 wherein the zirconia is stabilized with yttria.

22. The method of claim 1 further including the additional step of roughening the preselected surfaces prior to applying the ceramic material.

23. The method of claim 1 wherein the step of preselecting first surfaces of the superalloy component includes selecting external surfaces of the superalloy component.

24. The method of claim 1 wherein the step of applying an environmental coating to the predetermined areas of the superalloy component includes applying the coating to the internal passageways.

25. The method of claim 1 wherein the superalloy component is selected from the group consisting of a turbine blade, a turbine vane and a combustor liner.

26. A method for applying an environmental coating to preselected areas of a superalloy component having internal passageways, comprising the steps of:
providing a turbine engine component comprising a superalloy;
providing the component with a surface finish of at least 32 microinches;
cleaning the component with a solvent; then
rinsing the component with deionized water;
providing a positive pressure of gas through the internal passageways;
while providing the positive pressure of gas, applying a masking material comprising yttria-stabilized zirconia having 7% yttria and an inert filler to at least a portion of the external surfaces of the component; then
applying an environmental coating to flip component by exposing surfaces of the component to a gas phase of the environmental coating, thereby depositing the coating on the unmasked surfaces; and then
removing the masking material from the component.

27. The method of claim 26 wherein the inert filler includes particles of YSZ.

* * * * *

UNITED STATES PATENT AND TRADEMARK OFFICE
CERTIFICATE OF CORRECTION

PATENT NO.        : 6,884,476 B2                                              Page 1 of 1
APPLICATION NO. : 10/281544
DATED             : April 26, 2005
INVENTOR(S)       : Pfaendtner et al.

It is certified that error appears in the above-identified patent and that said Letters Patent is hereby corrected as shown below:

On the Title page, Item (75) insert Inventor -- John Ackermann, Laramie WY (US) --

In column 1, line 39 "therefore, or" should be -- therefore; or --

In column 10, line 55 "atop" should be -- step --

In column 12, line 19 "flip" should be -- the --

Signed and Sealed this

Ninth Day of September, 2008

JON W. DUDAS
*Director of the United States Patent and Trademark Office*